United States Patent
Baba et al.

(10) Patent No.: US 9,532,469 B2
(45) Date of Patent: Dec. 27, 2016

(54) MULTILAYER SUBSTRATE

(71) Applicant: FUJITSU LIMITED, Kawasaki-shi, Kanagawa (JP)

(72) Inventors: Shunji Baba, Yokohama (JP); Takashi Kanda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/317,498

(22) Filed: Jun. 27, 2014

(65) Prior Publication Data

US 2015/0008018 A1   Jan. 8, 2015

(30) Foreign Application Priority Data

Jul. 2, 2013   (JP) .................. 2013-139302

(51) Int. Cl.
H05K 1/02 (2006.01)
H05K 1/11 (2006.01)
H05K 3/46 (2006.01)
H05K 1/14 (2006.01)

(52) U.S. Cl.
CPC .......... *H05K 3/4694* (2013.01); *H05K 1/0298* (2013.01); *H05K 1/11* (2013.01); *H05K 1/14* (2013.01); *H05K 2201/0352* (2013.01); *H05K 2203/061* (2013.01)

(58) Field of Classification Search
CPC ............ H05K 1/0298; H05K 2201/041; H05K 3/4694; H05K 2203/061; H05K 2201/0352; H05K 1/0277; H05K 1/0278; H05K 1/11; H05K 1/119; H05K 1/14; H05K 1/141; H05K 1/142; H05K 1/147; H05K 3/4623; H05K 2201/045; H05K 2201/048; H05K 2201/042

USPC .................. 174/250–268; 361/760, 792–795
See application file for complete search history.

(56) References Cited

U.S. PATENT DOCUMENTS

| | | | | |
|---|---|---|---|---|
| 8,400,776 B2 * | 3/2013 | Sahara | ................... | H05K 1/183 174/259 |
| 8,431,829 B2 * | 4/2013 | Takahashi | ............... | H01L 24/24 174/255 |
| 2005/0037535 A1 | 2/2005 | Ogawa et al. | | |
| 2011/0019383 A1 * | 1/2011 | Aoyama | ................ | H05K 1/142 361/792 |
| 2011/0100698 A1 * | 5/2011 | Naganuma | ........... | H05K 3/4602 174/264 |

FOREIGN PATENT DOCUMENTS

| | | |
|---|---|---|
| JP | 2001-035964 A | 2/2001 |
| JP | 2004-128029 A | 4/2004 |
| JP | 2005-223166 A | 8/2005 |
| JP | 2006-005097 A | 1/2006 |

* cited by examiner

*Primary Examiner* — Ishwarbhai B Patel
(74) *Attorney, Agent, or Firm* — Squire Patton Boggs (US) LLP

(57) ABSTRACT

A multilayer substrate includes a first substrate a second substrate that is stacked on and electrically connected to the first substrate, the second substrate having a different characteristic from a characteristic of the first substrate, a third substrate that is provided on a side of the first substrate, the second substrate being provided on the side of the first substrate, and the third substrate is electrically connected to the second substrate, and a connection member that electrically connects the first substrate and the third substrate to each other while the second substrate is bypassed.

9 Claims, 9 Drawing Sheets

MULTILAYER SUBSTRATE

CROSS-REFERENCE TO RELATED APPLICATION

This application is based upon and claims the benefit of priority of the prior Japanese Patent Application No. 2013-139302, filed on Jul. 2, 2013, the entire contents of which are incorporated herein by reference.

FIELD

The embodiments discussed herein are related to a multilayer substrate.

BACKGROUND

There exists a multilayer substrate that is formed by stacking and integrating a plurality of substrates. As an example of the multilayer substrate, Japanese Laid-open Patent Publication No. 2004-128029 discloses a multilayer substrate in which a high-frequency circuit component is mounted on a base substrate. Furthermore, Japanese Laid-open Patent Publication No. 2006-5097 discloses a multilayer substrate in which a plurality of thin-film multilayer circuits are formed on a base substrate.

When a substrate (a second substrate) that has a characteristic, such as a wiring density, that is different from a characteristic of another substrate (a first substrate) is stacked on the other substrate (the first substrate), there are cases in which an electric connection between the first substrate and the second substrate is realized on the surface of the second substrate that opposes the first substrate. When through vias are formed in the first substrate to enable connection in the direction of the plate thickness, wiring that electrically connects the first substrate and the second substrate is, in some cases, formed so as to bypass the through vias.

SUMMARY

According to an aspect of the invention, an apparatus includes a first substrate; a second substrate that is stacked on and electrically connected to the first substrate, the second substrate having a different characteristic from a characteristic of the first substrate; a third substrate that is provided on a side of the first substrate, the second substrate being provided on the side of the first substrate, and the third substrate is electrically connected to the second substrate; and a connection member that electrically connects the first substrate and the third substrate to each other while the second substrate is bypassed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A first embodiment is described with reference to the drawings.

Figure 1:
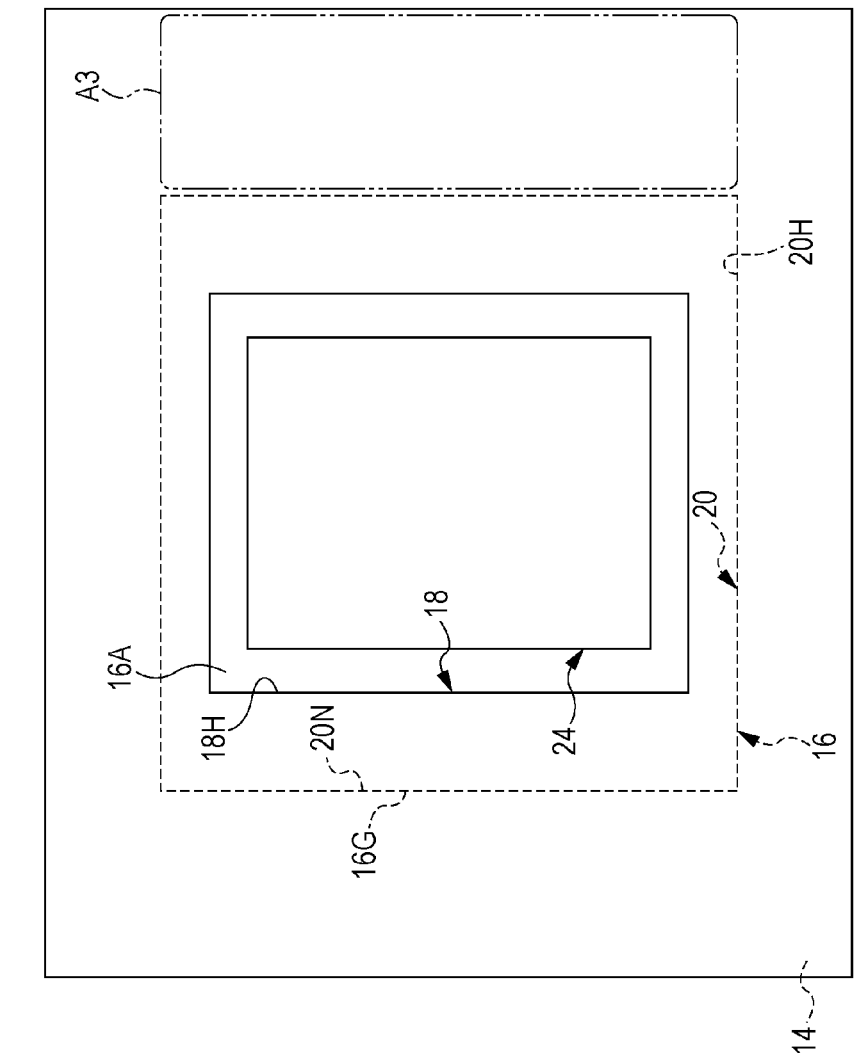
FIG. 1 is a plan view illustrating a multilayer substrate of a first embodiment.
Figure 2A:
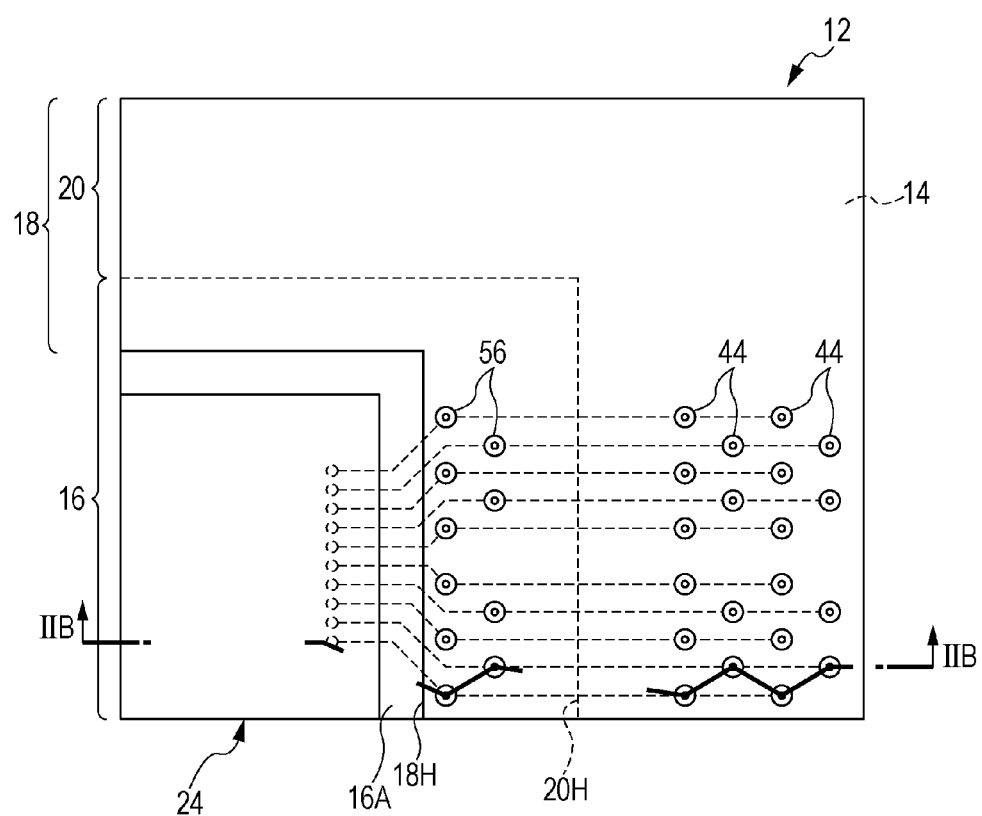
FIG. 2A is a plan view partially illustrating the multilayer substrate of the first embodiment.
Figure 2B:
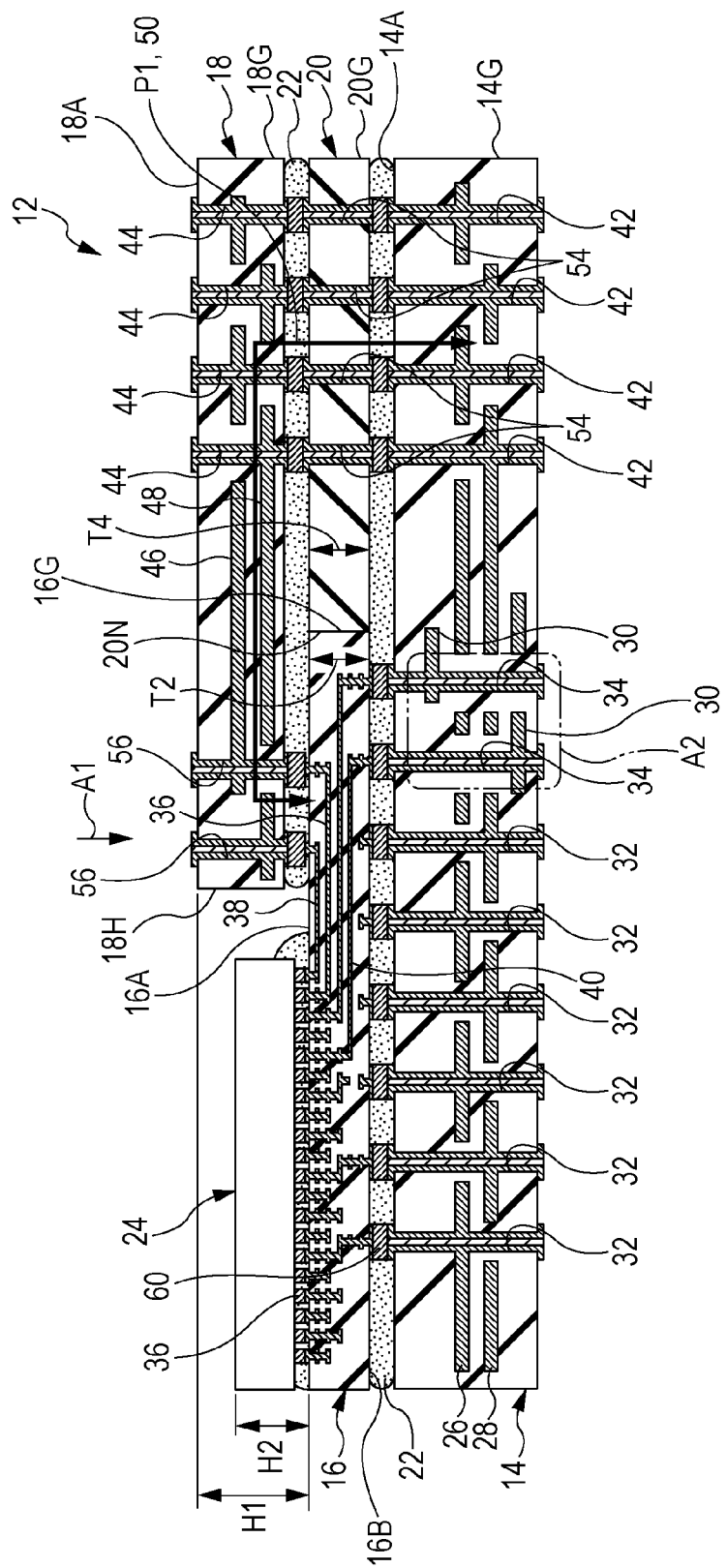
FIG. 2B is a cross-sectional view of the multilayer substrate of the first embodiment taken along the line IIB-IIB of FIG. 2A.

FIG. 1 illustrates the entirety of a multilayer substrate 12 of the first embodiment in plan view. FIG. 2A partially illustrates the multilayer substrate 12 in plan view. FIG. 2B illustrates a cross-section of the multilayer substrate 12 taken along the line IIB-IIB of FIG. 2A.

The multilayer substrate 12 includes a first substrate 14, a second substrate 16, a third substrate 18, and a fourth substrate 20. The substrates each include a substrate body that is a tabular-shaped paper or fiberglass body that is impregnated with an insulation resin material, such as a phenol resin, an epoxy resin, or the like. A direction normal to the substrate body, that is, the direction of the arrow A1, coincides with the viewing direction when the multilayer substrate 12 is viewed in plan view.

In the illustrated example, the first substrate 14 is rectangular in plan view; however, the shape of the first substrate 14 in plan view is not limited to a rectangular shape and may be square or another polygonal shape, circular, or the like.

The second substrate 16 is stacked on an upper surface 14A of the first substrate 14. In the example illustrated in FIG. 1, the second substrate 16 is arranged at the center of the first substrate 14 in plan view. In the illustrated example, the second substrate 16 is rectangular in plan view; however, the shape of the second substrate 16 in plan view is not limited to a rectangular shape and may be square or another polygonal shape, circular, or the like.

The second substrate 16 is adhered to the first substrate 14 with an adhesive 22. In the state described above in which the first substrate 14 and the second substrate 16 are stacked, the lower side of FIG. 2B with respect to the border between the first substrate 14 and the second substrate 16 is referred to as the first substrate side and the upper side is referred to as the second substrate side.

Note that in each of the substrates, the surface facing the upper side of FIG. 2B is simply referred to as an upper surface and the surface facing the lower side of FIG. 2B is simply referred to as an undersurface. However, the multilayer substrate 12 may have an arrangement different from that illustrated in FIG. 2B during the manufacturing process or after being mounted on an electronic device, for example; accordingly, here, "upper surface" and "undersurface" are expressions used to facilitate description.

The fourth substrate 20 is stacked on the upper surface 14A of the first substrate 14. An opening 20H that holds the second substrate 16 is formed in the fourth substrate 20. In the illustrated example, the opening 20H is rectangular. The shape of the opening 20H is formed so as to correspond to the shape of the second substrate 16 in plan view.

Similarly to the second substrate 16, the fourth substrate 20 is also adhered to the first substrate 14 with the adhesive 22. The thickness T2 of the second substrate 16 and the thickness T4 of the fourth substrate 20 are the same. The fourth substrate 20 is an example of a connection member.

In plan view, an outer edge 16G of the second substrate 16 and an inner edge 20N of the fourth substrate 20 are in contact with each other throughout the whole circumference. In plan view, an outer edge 20G of the fourth substrate 20 and an outer edge 14G of the first substrate 14 coincide with each other throughout the whole circumference.

The third substrate 18 is stacked on the second substrate 16 and the fourth substrate 20 on the side that is opposite to the first substrate 14, in other words, the second substrate side. An opening 18H is formed in the third substrate 18 as well. In the illustrated example, the opening 18H is rectangular; however, the opening 18H is not limited to a rectangular shape. In the example illustrated in FIG. 1 in which the opening 18H is rectangular, the dimensions of the opening 18H in the longitudinal direction and the transverse direction are both shorter than the corresponding dimensions of the opening 20H of the fourth substrate 20.

As seen in FIGS. 1, 2A, and 2B, in plan view, a portion of the third substrate 18 that is close to an inner edge 18N partially overlaps a portion of the second substrate 16 that is close to the outer edge 16G. Furthermore, the opening 18H exposes a portion of an upper surface 16A of the second substrate 16 to the side that is opposite to the first substrate 14.

The third substrate 18 is adhered to the second substrate 16 and the fourth substrate 20 with the adhesive 22. In the first embodiment, an outer edge 18G of the third substrate 18 coincides with the outer edge 14G of the first substrate 14 throughout the whole circumference in plan view. Accordingly, when the multilayer substrate 12 is viewed as a whole, the outer edge 14G of the first substrate 14, the outer edge 18G of the third substrate 18, and the outer edge 20G of the fourth substrate 20 coincide with each other in plan view.

As described above, the portion of the second substrate 16 that is not in contact with the third substrate 18 is exposed. A component 24 is mounted on this exposed portion. Integrated circuit chips and other electric element parts may be cited as examples of the component.

A height H1 of the third substrate 18, in other words, the distance from the upper surface of the fourth substrate 20, is larger than a height H2 of the component 24, in other words, the distance from the upper surface 16A of the second substrate 16.

As illustrated in FIG. 2B and FIGS. 3 to 5, power wiring 26, ground wiring 28, and signal wiring 30 are formed inside the first substrate 14. In the illustrated example, the power wiring 26 and the ground wiring 28 are formed in the middle portion of the first substrate 14 in the thickness direction, and the signal wiring 30 is formed above and below the power wiring 26 and the ground wiring 28; however, the arrangement of each wiring is not limited to the above arrangement.

Power wiring 36, ground wiring 38, and signal wiring 40 are formed inside the second substrate 16. The wiring density of the signal wiring 40 in the second substrate 16 is higher than the wiring density of the signal wiring 30 in the first substrate 14. The above-mentioned "wiring density" is the total wiring length per unit area of the substrate.

Figure 4:
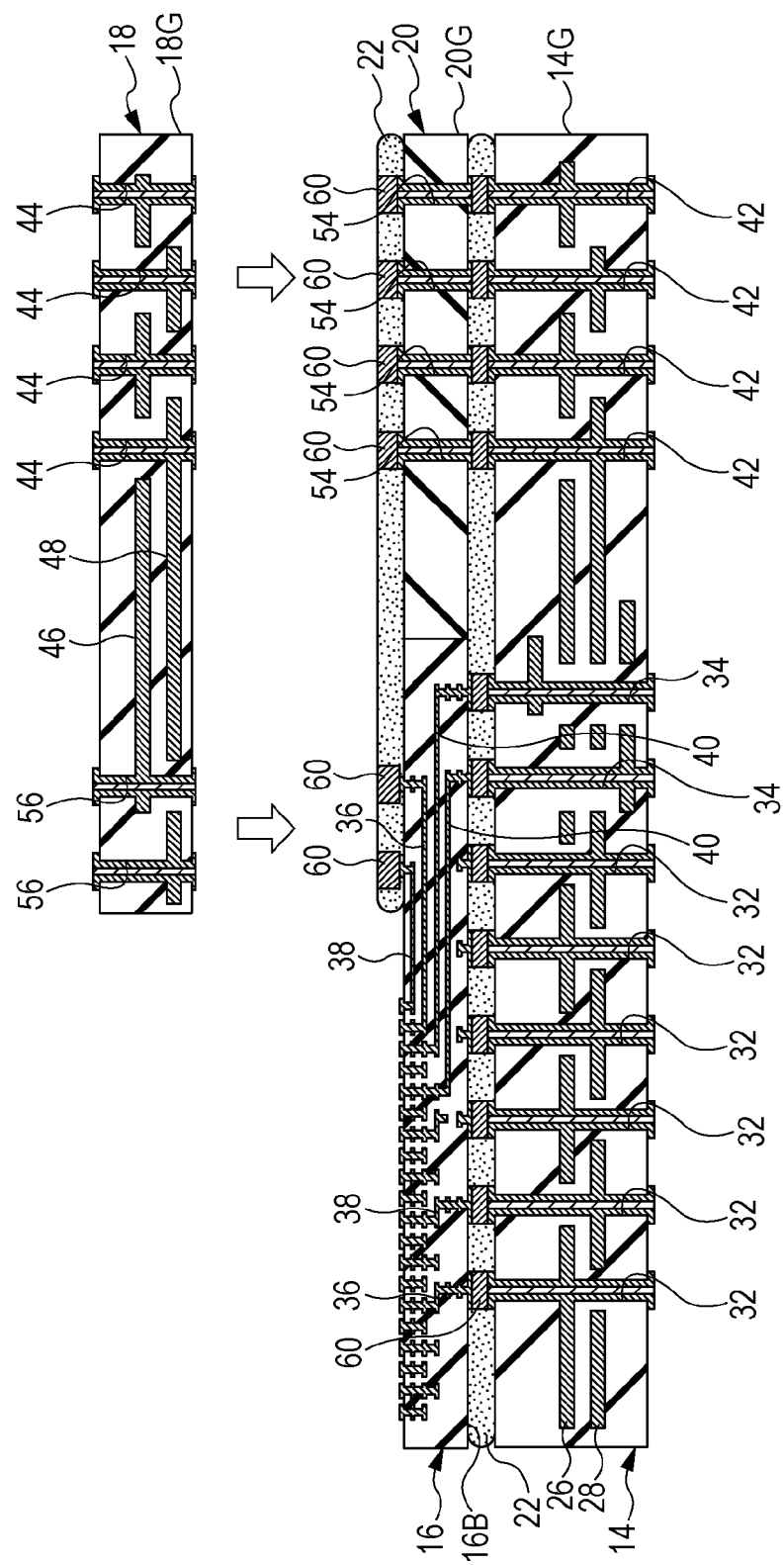
FIG. 4 is a cross-sectional view illustrating the multilayer substrate of the first embodiment in the course of the manufacturing process.
Figure 5:
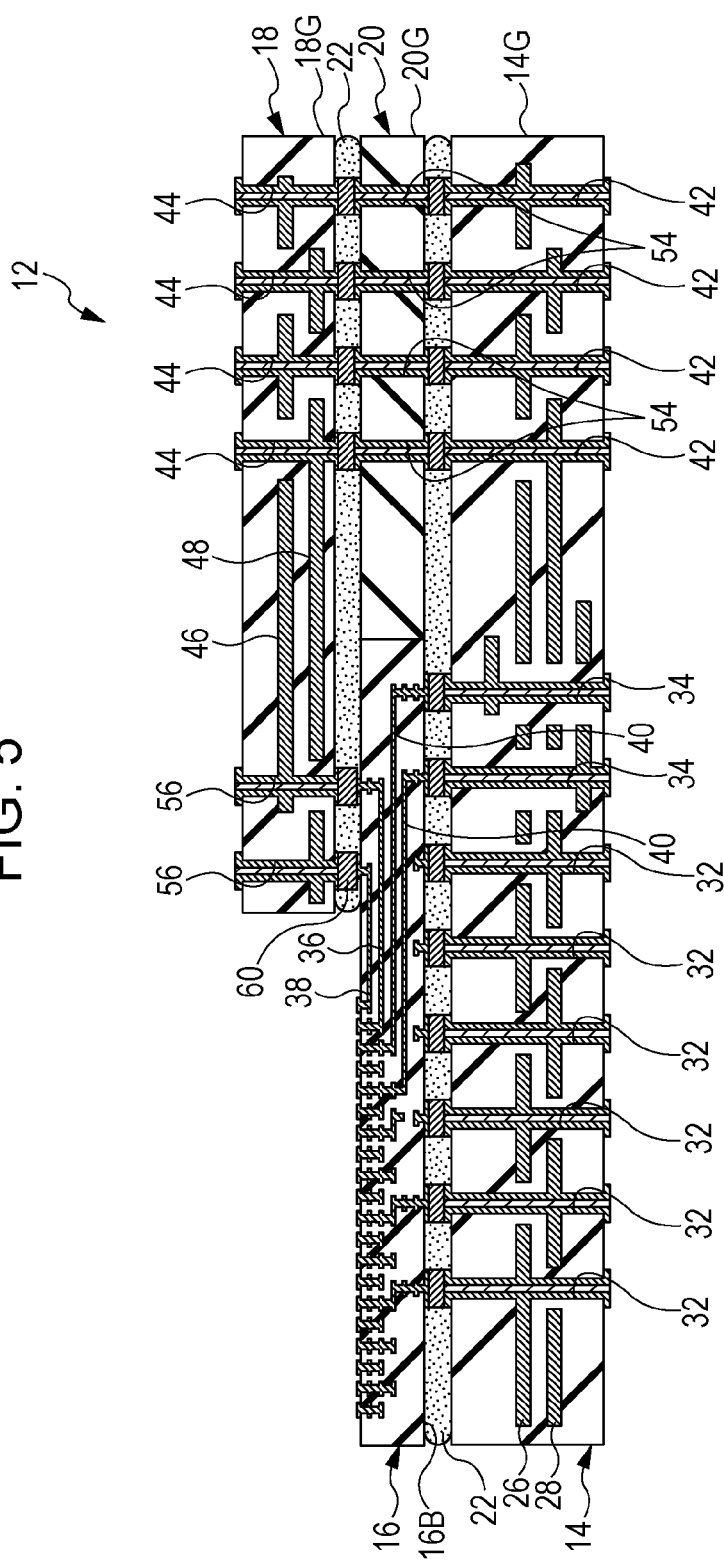
FIG. 5 is a cross-sectional view illustrating the multilayer substrate of the first embodiment in the course of the manufacturing process.

As illustrated in FIGS. 2B, 4, and 5, power wiring 46 and ground wiring 48 are formed inside the third substrate 18. Note that in the illustrated example, while the power wiring 46 is arranged at a position that is far from the first substrate 14, in other words, on the upper side, and the ground wiring 48 is arranged at a position that is near the first substrate 14, in other words, on the lower side, the positional relationship between the power wiring 46 and the ground wiring 48 is not limited to the above positional relationship.

A plurality of through vias 32 and 34 that penetrate the first substrate 14 in the thickness direction are formed in an area of the first substrate 14 that overlaps the second substrate 16 in plan view. Inner portions of the through vias 32 and 34 are subjected to a specific plating process and the like, and conduction in the longitudinal direction of the first substrate 14 is obtained by conductors inside the through vias 32 and 34. Note that the same applies to the other through vias that are described later in that conduction in the longitudinal direction is allowed.

The through vias 32 connected to the power wiring 26 and the through vias 32 connected to the ground wiring 28 are electrically connected to the connection terminals of the power wiring 36 of the second substrate 16 and the connection terminals of the ground wiring 38 of the second substrate 16, respectively, through conductive material portions 60 at an undersurface 16B, in other words, at the surface opposing the first substrate 14.

Conversely, the through vias 34 connected to the signal wiring 30 are electrically connected to the connection terminals of the signal wiring 40 of the second substrate 16 through the conductive material portions 60.

A single or a plurality of through vias 42 that penetrate the first substrate 14 in the thickness direction are formed in an area of the first substrate 14 that does not overlap the second substrate 16 in plan view. A single or a plurality of through vias 44 that penetrate the third substrate 18 in the thickness direction are formed in the same number as that of the through vias 42 in an area of the third substrate 18 that does not overlap the second substrate 16 in plan view. In plan view, each of the through vias 44 is formed at a position that coincides with the position of a corresponding one of the through vias 42.

The through vias 42 of the first substrate 14 are each connected to the power wiring 26 or the ground wiring 28 of the first substrate 14. The through vias 44 of the third substrate 18 are each connected to the power wiring 46 or the ground wiring 48 of the third substrate 18.

A single or a plurality of through vias 54 that penetrate the fourth substrate 20 in the thickness direction are formed in the same number as that of the through vias 42. In plan view, each of the through vias 54 is formed at a position that coincides with the position of a corresponding one of the through vias 42 or 44.

Through vias 56 that penetrate the third substrate 18 in the thickness direction are further formed in an area of the third substrate 18 that overlaps the second substrate 16 in plan view. The through vias 56 that are connected to the power wiring 46 of the third substrate 18 are electrically connected to the power wiring 36 of the second substrate 16 through the conductive material portions 60. The through vias 56 that are connected to the ground wiring 48 of the third substrate 18 are electrically connected to the ground wiring 38 of the second substrate 16 through the conductive material portions 60.

Accordingly, each of the through vias 42 connected to the power wiring 26 or the ground wiring 28 in the first substrate 14 is in communication with a corresponding one of the through vias 54 of the fourth substrate 20. Moreover, electric power may be supplied to the second substrate 16 from the upper surface 16A through the through vias 54 of the fourth substrate 20, the through vias 44 of the third substrate, the power wiring 26 or the ground wiring 28 in the third substrate 18, and the through vias 56 of the third substrate. In other words, the fourth substrate 20 electrically connects the first substrate 14 and the third substrate 18 to each other while bypassing the second substrate 16 and, furthermore, electrically connects the third substrate 18 and the second substrate 16 to each other, such that an electric power supply path 50 illustrated by the arrow P1 in FIG. 2B is formed.

A function of the first embodiment is described next.

The multilayer substrate 12 of the first embodiment is capable of supplying electric power to the second substrate 16 from the undersurface 16B of the second substrate 16 through the power wiring 26 and the ground wiring 28 of the first substrate 14 and the through vias 32.

Furthermore, electric power may also be supplied to the second substrate 16 from the first substrate 14 through the electric power supply path 50 illustrated by the arrow P1 in FIG. 2B.

In other words, electric power may be supplied from the first substrate 14 to the second substrate 16 through both surfaces of the second substrate 16, that is, through both the upper surface 16A and the undersurface 16B.

Incidentally, since the power wiring 26 and the ground wiring 28 are formed so as to bypass the through vias 34 in an area A2 of the first substrate 14, there are cases in which the electrical resistance becomes high in the area A2 of the first substrate 14 owing to, for example, the narrowness of the line width. However, as illustrated by the arrow P1, the multilayer substrate 12 of the first embodiment is capable of supplying electric power to the second substrate 16 while bypassing the area A2 of the first substrate 14 where the electrical resistance is high.

Accordingly, an increase in electrical resistance is practically suppressed when electric power is supplied from the first substrate 14 to the second substrate 16. Moreover, compared with a structure in which the electric power supply path 50 illustrated by the arrow P1 is absent, the amount of electric power that may be supplied to the second substrate 16 from the first substrate 14 is large.

Furthermore, in the multilayer substrate 12 of the first embodiment, the height H1 of the third substrate 18 is larger than the height H2 of the component 24. Accordingly, when work such as soldering and the like is carried out to mount another component on an upper surface 18A of the third substrate 18, for example, compared with a structure in which the height H2 of the component 24 is larger than the height H1 of the third substrate 18, work efficiency is improved since the component 24 does not get in the way.

An exemplary method for manufacturing the multilayer substrate 12 of the first embodiment is described next.

Figure 3:
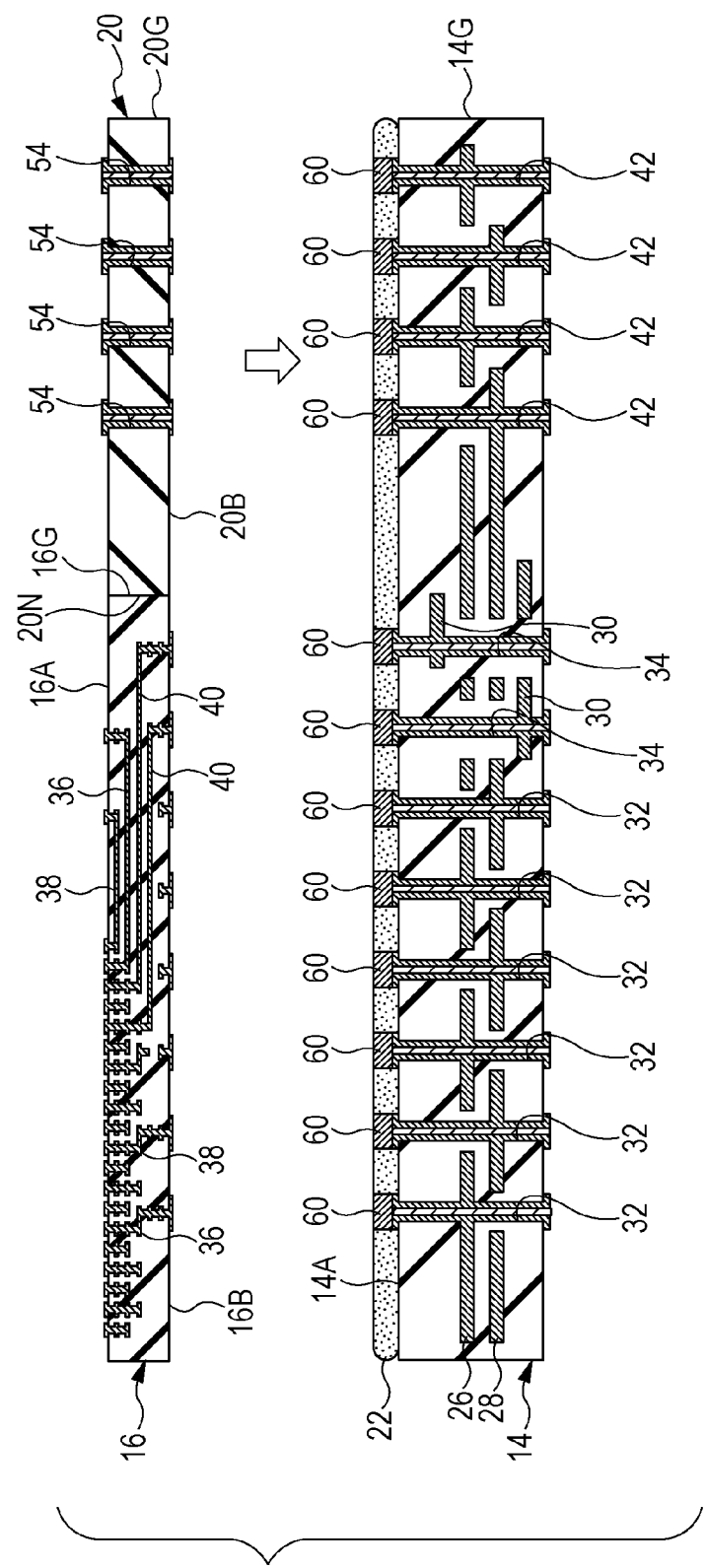
FIG. 3 is a cross-sectional view illustrating the multilayer substrate of the first embodiment in the course of a manufacturing process.

As illustrated in FIG. 3, the second substrate 16 and the fourth substrate 20 are stacked on the first substrate 14 and are adhered to the first substrate 14 with the adhesive 22. Furthermore, conductive material portions 60 electrically connect the first substrate 14 to the second substrate 16 and the fourth substrate 20 at portions where electrical connections are to be made.

Note that in the illustrated example, an example is given in which the adhesive 22 and the conductive material portions 60 are arranged above the upper surface 14A of the first substrate 14; however, the adhesive 22 and the conductive material portions 60 may be arranged below the undersurface 16B of the second substrate 16 and below an undersurface 20B of the fourth substrate 20. Furthermore, the outer edge 16G of the second substrate 16 and the inner edge 20N of the fourth substrate 20 may be adhered to each other before being adhered to the first substrate 14. Alternatively, the second substrate 16 and the fourth substrate 20 may be adhered to the first substrate 14 such that the outer edge 16G of the second substrate 16 and the inner edge 20N of the fourth substrate 20 maintain contact with each other.

Next, as illustrated in FIG. 4, the third substrate 18 is stacked on the second substrate 16 and the fourth substrate 20 and is adhered to the second substrate 16 and the fourth substrate 20 with the adhesive 22. The conductive material portions 60 electrically connect the second substrate 16 and the fourth substrate 20 to the third substrate 18 at portions where electrical connections are to be made. With the above process, as illustrated in FIG. 5, the multilayer substrate 12 before the component 24 is mounted thereon is obtained, the multilayer substrate 12 being formed by integrating the first substrate 14, the second substrate 16, the third substrate 18, and the fourth substrate 20.

Subsequently, the component 24 is mounted on the upper surface of the second substrate 16.

As described above, the multilayer substrate 12 of the first embodiment may be manufactured by stacking the second substrate 16 and the fourth substrate 20 on the first substrate 14 and, further, by stacking the third substrate 18 on the second substrate 16 and the fourth substrate 20.

A description of a second embodiment is given next. In the second embodiment, elements, components, and the like that are the same as those of the first embodiment are denoted with the same reference numerals and detailed descriptions thereof are omitted appropriately.

Figure 6:
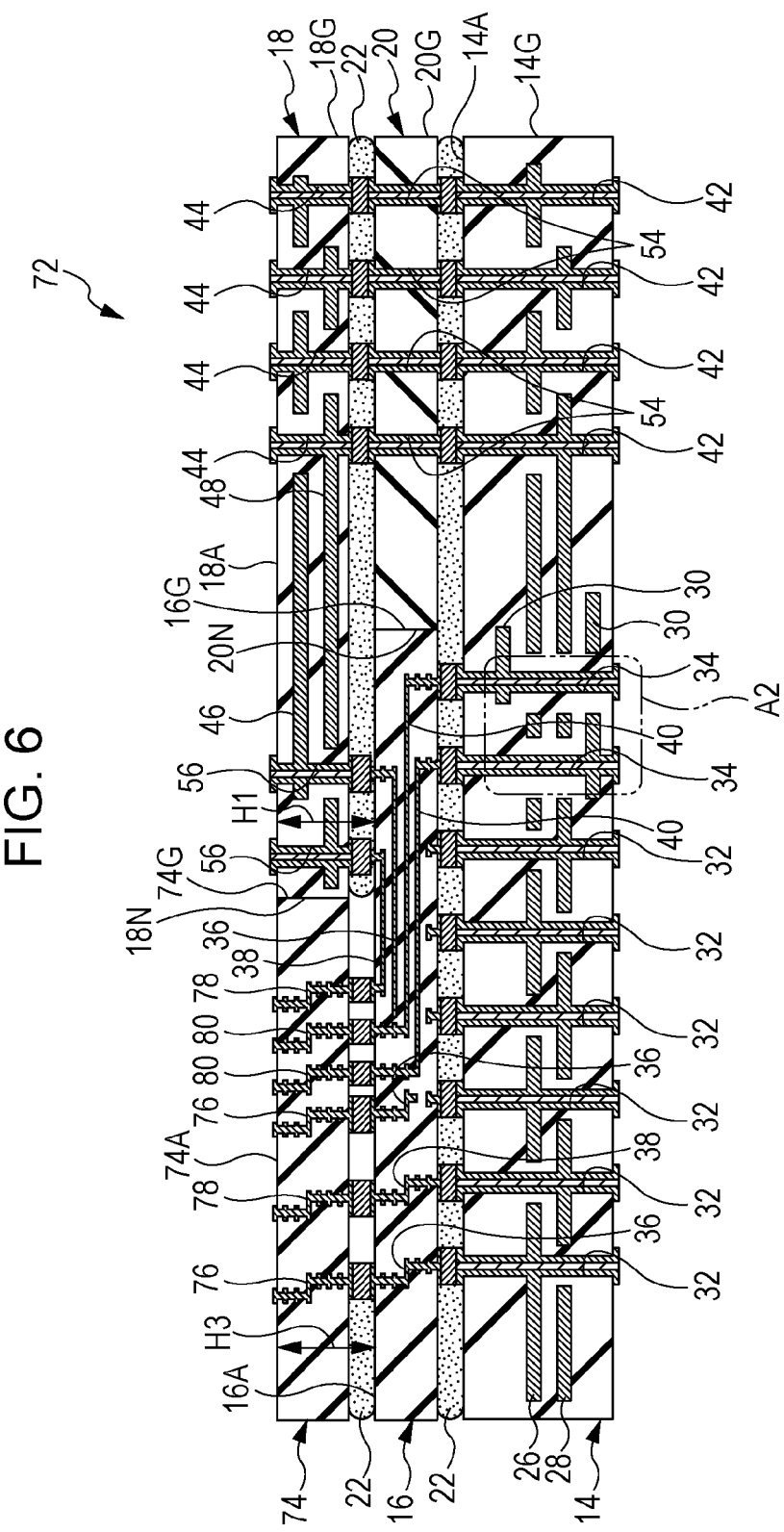
FIG. 6 is a cross-sectional view partially illustrating a multilayer substrate of a second embodiment.

As illustrated in FIG. 6, in a multilayer substrate 72 of the second embodiment, a fifth substrate 74 is stacked on the upper surface 16A of the second substrate 16 in place of the component 24 of the first embodiment (see FIG. 2B). Power wiring 76, ground wiring 78, and signal wiring 80 are formed inside the fifth substrate 74. Electric power is supplied to the fifth substrate 74 through the power wiring 36 and the ground wiring 38 of the second substrate 16. Furthermore, transmission and reception of signals to and from the fifth substrate 74 are carried out through the signal wiring 30 of the second substrate 16.

A thickness of the fifth substrate 74 and the thickness of the third substrate 18 are the same. In other words, a height H3 of the fifth substrate 74 from the upper surface 16A of the second substrate 16 is equivalent to the height H1 of the third substrate 18 from the upper surface 16A of the second substrate 16.

In plan view, an outer edge 74G of the fifth substrate 74 and the inner edge 18N of the third substrate 18 are in contact with each other throughout the whole circumference. Accordingly, positional deviation of the fifth substrate 74 is reduced.

In the multilayer substrate 72 of the second embodiment as well, electric power may be supplied to the second substrate 16 from both the upper surface 16A and the undersurface 16B. Electric power may be supplied to the second substrate 16 while bypassing the area A2 in the first substrate 14 where the electrical resistance of the power wiring 26 and the ground wiring 28 is high.

In the multilayer substrate 72 of the second embodiment, the thickness of the fifth substrate 74 is the same as the thickness of the third substrate 18. Moreover, an upper surface 74A of the fifth substrate 74 and the upper surface 18A of the third substrate 18 are arranged on the same plane. The upper surface 74A of the fifth substrate 74 does not protrude out from the upper surface 18A of the third substrate 18; accordingly, since there is no protrusion that is in the way when another component is mounted on the upper surface 74A of the fifth substrate 74, for example, mounting work is facilitated.

The wiring density of the fifth substrate 74 according to the second embodiment is not limited to a particular density, and the fifth substrate 74 may adopt a substrate that has a wiring density that is higher than the wire density of the first substrate 14. In such a case, in addition to supplying electric power to the fifth substrate 74, which is a substrate with high wire density, from the first substrate 14 through the path passing directly through the second substrate 16, electric power may be supplied to the fifth substrate 74 from the first substrate 14 through the path passing through the fourth substrate 20, the third substrate 18, and the second substrate 16 as well.

A description of a third embodiment is given next. In the third embodiment, elements, components, and the like that are the same as those of the first embodiment are denoted with the same reference numerals and detailed descriptions thereof are omitted.

Figure 7:
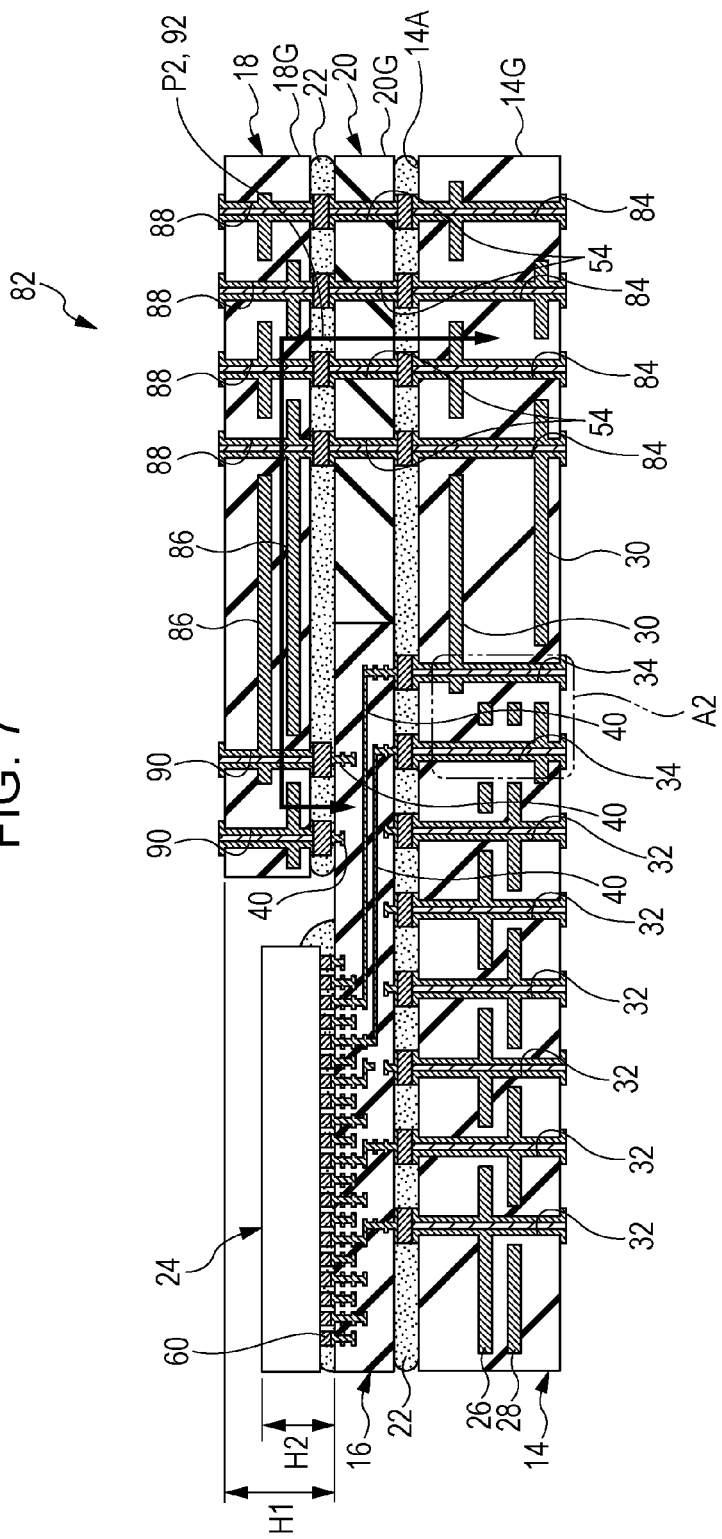
FIG. 7 is a cross-sectional view partially illustrating a multilayer substrate of a third embodiment.

As illustrated in FIG. 7, in a multilayer substrate 82 of the third embodiment, through vias 84 that are connected to the signal wiring 30 are formed in the first substrate 14. Furthermore, signal wiring 86 is formed in the third substrate 18 in place of the power wiring 46 and the ground wiring 48 according to the first embodiment. Moreover, through vias 88 and 90 that are connected to the signal wiring 86 are formed in the third substrate 18. With the above configuration, the signal wiring 30 of the first substrate 14 is electrically connected to the upper surface 16A of the second substrate 16 through the fourth substrate 20 and the third substrate 18.

Accordingly, in the third embodiment, as illustrated by the arrow P2, a signal transmission and reception path 92 is formed from the first substrate 14 to the upper surface 16A of the second substrate 16 through the fourth substrate 20 and the third substrate 18.

In the multilayer substrate 82 of the third embodiment, transmission and reception of signals to and from the first substrate 14 may be carried out through both the undersurface 16B and the upper surface 16A of the second substrate 16. Incidentally, even if there is an area A2 in the first substrate 14 where electrical resistance of the signal wiring 30 is high, transmission and reception of signals between the first substrate 14 and the second substrate 16 may be carried out while bypassing the area A2.

A description of a fourth embodiment is given next. In the fourth embodiment, elements, components, and the like that are the same as those of the first embodiment or the third embodiment are denoted with the same reference numerals and detailed descriptions thereof are omitted.

Figure 8:
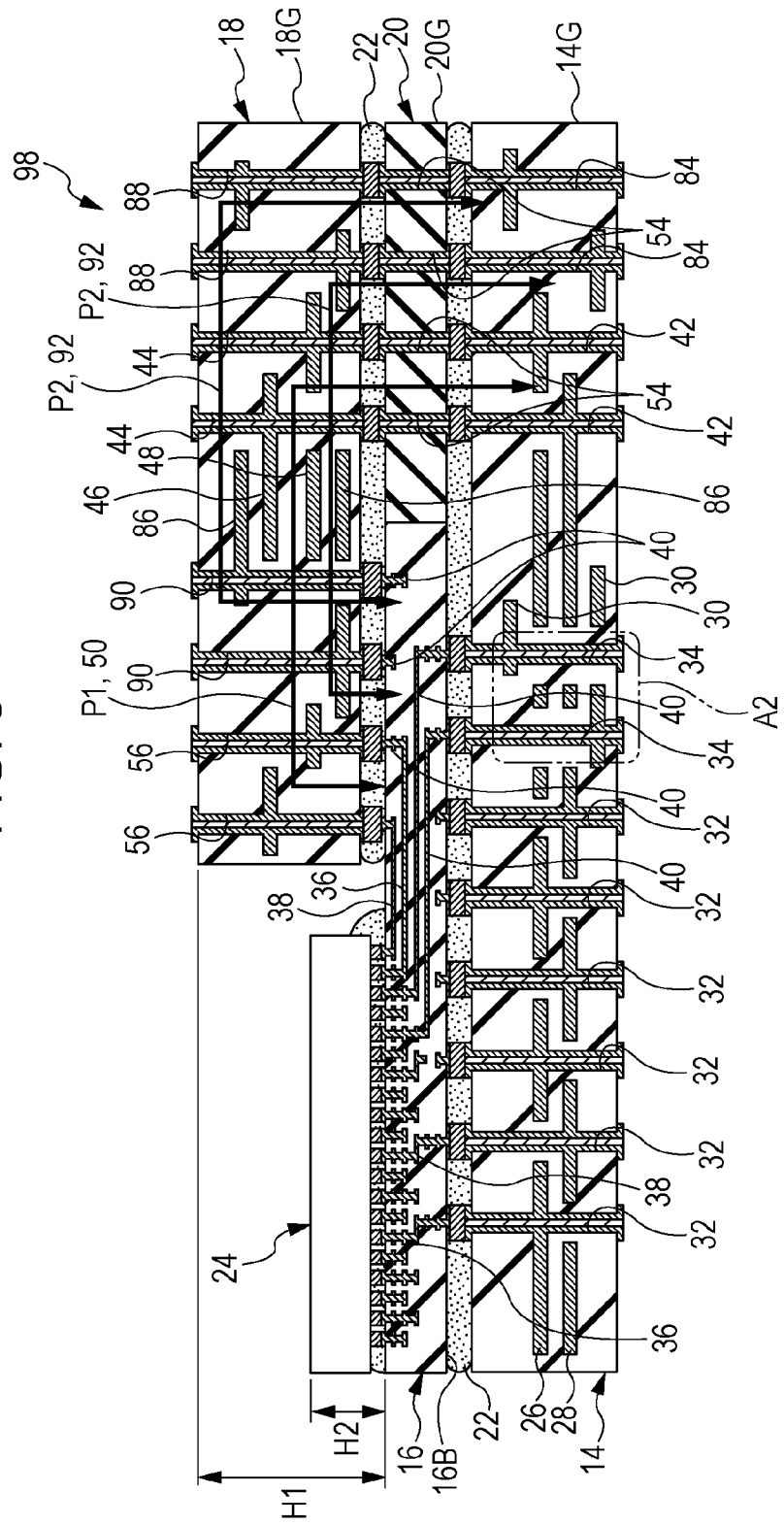
FIG. 8 is a cross-sectional view partially illustrating a multilayer substrate of a fourth embodiment.

As illustrated in FIG. 8, in a multilayer substrate 98 of the fourth embodiment, through vias 32, 34, and 84 are formed in the first substrate 14.

Furthermore, power wiring 46, ground wiring 48, and signal wiring 86, as well as through vias 44, 56, 88, and 90, are formed in the third substrate 18. In other words, the multilayer substrate 98 of the fourth embodiment is provided with both the electric power supply path 50 according to the first embodiment and the signal transmission and reception path 92 according to the third embodiment.

The structure described above including both the electric power supply path 50 and the signal transmission and reception path 92 allows electric power to be supplied to the second substrate 16 and signals to be transmitted and received by the second substrate 16 while bypassing the area A2 in the first substrate 14 where the electrical resistance of the power wiring 26 and the ground wiring 28 is high.

Note that in the third embodiment and the fourth embodiment, similar to the second embodiment, the fifth substrate 74 may be stacked on in place of the component 24.

While the fourth substrate 20 is cited as an example of the connection member in the above description, the connection member is not limited to such a substrate. For example, as an alternative of the fourth substrate 20, a block-like member, which is not a substrate, embedded with connection members that connect the through vias 42 of the first substrate 14 and the through vias 44 of the third substrate 18 (see FIG. 2B for both) to each other may be employed or a simple wiring may be employed.

Note that the above block-like member and the wiring are not substrates and, accordingly, there may be cases in which the block-like member and the wiring become cumbersome during the manufacturing process and for the manufacturing apparatus that manufacture the multilayer substrate 12 by stacking the first substrate 14, the second substrate 16, and the third substrate 18 together. Conversely, when the fourth substrate 20 described above is employed, the fourth substrate 20 may be handled in a similar manner as the first substrate 14, the second substrate 16, and the third substrate 18 are handled during the manufacturing process and by the manufacturing apparatus that manufacture the multilayer substrate 12 by stacking the first substrate 14, the second substrate 16, and the third substrate 18 together.

In the above description, while the fourth substrate 20 is shaped so as to surround the second substrate 16 in plan view, the shape of the fourth substrate 20 is not limited to such a shape that surrounds the second substrate 16. For example, the fourth substrate 20 may be arranged only in the area A3 of FIG. 1 that is an area next to one of the sides (edge portions) of the second substrate 16. As described above, the fourth substrate 20 that is shaped so as to surround the second substrate 16 in plan view uses the whole circumferential area of the second substrate 16, that is, all the four sides of the second substrate 16 in plan view, to supply electric power and to perform transmission and reception of signals; accordingly, degree of wiring freedom is increased.

The fourth substrate 20 described above includes a substrate body. The same material as the material used for the substrate body of the first substrate 14 and the substrate body of the third substrate 18 may be used for the substrate body of the fourth substrate 20. As described above, by using the same material for the substrate bodies of the first substrate 14, the third substrate 18, and the fourth substrate 20, an adhesiveness between the first substrate 14 and the fourth substrate 20 and an adhesiveness between the third substrate 18 and the fourth substrate 20, when adhered with the adhesive 22, are increased.

The thickness T4 of the fourth substrate 20 described above and the thickness T2 of the second substrate 16 are the same. Accordingly, the third substrate 18 may be stacked on the second substrate 16 and the fourth substrate 20 without creating any gap between the third substrate 18 and the second substrate 16 and between the third substrate 18 and the fourth substrate 20.

In the above description, the opening 20H is formed in the fourth substrate 20 in plan view such that the fourth substrate 20 is shaped so as to surround the second substrate 16; accordingly, the inner edge 20N of the fourth substrate 20 is in contact with the outer edge 16G of the second substrate 16. Since the inner edge 20N of the fourth substrate 20 and the outer edge 16G of the second substrate 16 are in contact with each other, positional deviation of the second substrate 16 may be reduced.

The outer edge 14G of the first substrate 14, the outer edge 18G of the third substrate 18, and the outer edge 20G of the fourth substrate 20 coincide with each other in plan view. Since the outer edges of the first substrate 14, the third substrate 18, and the fourth substrate 20 coincide with each other, the multilayer substrate 12 as a whole does not have any protrusions and, thus, has an advantage in its ease of handling.

The shape of the third substrate 18 is not limited to one having an opening 18H. As described above, by using the third substrate 18 shaped so as to have the opening 18H, it is possible to partially expose the second substrate 16. Moreover, it is possible to mount a component on the exposed portion of the second substrate 16.

In the above description, the second substrate 16 is a substrate that has a higher wiring density than that of the first substrate 14; however, the second substrate 16 is not limited to such a substrate with a high wiring density. In other words, the above-described structure may adopt any kind of substrate that has a characteristic that is different from that of the first substrate 14 and supply electric power to the second substrate 16 and transmit and receive signals to and from the second substrate 16 while the area in the first substrate 14 that has high electrical resistance is bypassed. Substrates that have a characteristic that is different from the first substrate 14 include a substrate in which the material of the substrate body is different, a substrate in which the material of the wiring is different, and the like. In a substrate such as the one described above that has high wiring density, electric power supplied to the substrate tends to be high as well; however, by adopting the above-described structure, electric power may be supplied from the first substrate 14 to the second substrate 16 efficiently.

Moreover, regarding the overall structure of the multilayer substrate, by employing a substrate (second substrate 16) with high wiring density only at portions where it is indispensable, a multilayer substrate that is capable of suppressing cost increase and that is capable of high-speed signal transmission and high-efficiency signal processing may be obtained.

The multilayer substrate may be used in any application. For example, the multilayer substrate may include a multilayer substrate that is provided inside large server apparatuses and super computers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A multilayer substrate, comprising:
    a first substrate;
    a first via and a second via that penetrate the first substrate;
    a second substrate that is stacked over the first substrate and electrically coupled to the first via;
    a fourth substrate that is stacked over the first substrate and includes a third via that is electrically coupled to the second via;
    a third substrate that is stacked over a part of the second substrate and the fourth substrate, and the third substrate includes a wiring that electrically couples the second substrate and the third via,
    wherein an opening that partially exposes the second substrate is formed in the third substrate, and
    wherein a component is mounted on an exposed portion of the second substrate.

2. The multilayer substrate according to claim 1, wherein power wiring and ground wiring of the first substrate are electrically connected to the second substrate through the fourth substrate and the third substrate.

3. The multilayer substrate according to claim 1, wherein signal wiring of the first substrate is electrically connected to the second substrate through the fourth substrate and the third substrate.

4. The multilayer substrate according to claim 1, wherein an outer edge of the first substrate, an outer edge of the third substrate, and an outer edge of the fourth substrate coincide with each other when viewed in a direction that is normal to the first substrate.

5. The multilayer substrate according to claim 1, wherein an inner edge portion of an opening formed in the fourth substrate is in contact with an outer edge of the second substrate.

6. The multilayer substrate according to claim 1, wherein a thickness of the fourth substrate and a thickness of the second substrate are equal.

7. The multilayer substrate according to claim 1, wherein a height of the third substrate from the second substrate is larger than a height of the component mounted on the second substrate.

8. The multilayer substrate according to claim 1, further comprising:
    a fifth substrate that is provided on the second substrate side, the fifth substrate being stacked at a position next to the third substrate, wherein
    a height of the fifth substrate from the second substrate and a height of the third substrate from the second substrate are equivalent.

9. The multilayer substrate according to claim 1, wherein a wiring density of the second substrate is higher than a wiring density of the first substrate.

* * * * *